(12) United States Patent
Yamashita

(10) Patent No.: US 8,871,602 B2
(45) Date of Patent: Oct. 28, 2014

(54) METHOD FOR MANUFACTURING MOLECULAR MEMORY DEVICE

(75) Inventor: Hiroki Yamashita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/422,488

(22) Filed: Mar. 16, 2012

(65) Prior Publication Data

US 2013/0059426 A1 Mar. 7, 2013

(30) Foreign Application Priority Data

Sep. 1, 2011 (JP) .................................. 2011-190472

(51) Int. Cl.
- *H01L 21/02* (2006.01)
- *H01L 27/28* (2006.01)
- *G11C 13/00* (2006.01)
- *H01L 51/05* (2006.01)

(52) U.S. Cl.
CPC .......... *H01L 27/285* (2013.01); *G11C 13/0014* (2013.01); *H01L 51/0591* (2013.01)
USPC .................... 438/382; 257/E21.004

(58) Field of Classification Search
USPC .................... 438/382; 257/E21.004
See application file for complete search history.

(56) References Cited

U.S. PATENT DOCUMENTS

| | | | | |
|---|---|---|---|---|
| 7,307,870 | B2 * | 12/2007 | Kuhr et al. | 365/151 |
| 7,799,702 | B1 * | 9/2010 | Tanaka | 438/758 |
| 2004/0256615 | A1 * | 12/2004 | Sirringhaus et al. | 257/40 |
| 2007/0045615 | A1 | 3/2007 | Cho et al. | |
| 2007/0090348 | A1 | 4/2007 | McCreery et al. | |
| 2009/0283739 | A1 * | 11/2009 | Kiyotoshi | 257/4 |

FOREIGN PATENT DOCUMENTS

JP 2009-283486 12/2009

OTHER PUBLICATIONS

Reed, M.A. et al., "Molecular random access memory cell", Applied Physics Letters, vol. 78, No. 23, pp. 3735-3737 (Jun. 4, 2001).
Notification of Reason(s) for Refusal issued by the Japanese Patent Office on May 13, 2014, for Japanese Patent Application No. 2011-190472, and English-language translation thereof.

* cited by examiner

*Primary Examiner* — Zandra Smith
*Assistant Examiner* — Damian A Hillman
(74) *Attorney, Agent, or Firm* — Finnegan, Henderson, Farabow, Garrett & Dunner, L.L.P.

(57) ABSTRACT

According to one embodiment, a method for manufacturing a molecular memory device includes: forming a first wiring layer including a plurality of first wirings extending in a first direction; forming a sacrificial film on the first wiring layer; forming a plurality of core members on the first wiring layer, the core member extending in a second direction crossing the first direction and being formed from an insulating material different from the sacrificial film; forming a second wiring on a side surface of the core member; removing a portion of the sacrificial film located immediately below the second wiring; embedding a polymer; and embedding an insulating. The embedding a polymer includes embedding a polymer serving as a memory material between the first wiring and the second wiring. The embedding an insulating member includes embedding an insulating member in a space between the second wirings between the core members.

10 Claims, 11 Drawing Sheets

METHOD FOR MANUFACTURING MOLECULAR MEMORY DEVICE

CROSS-REFERENCE TO RELATED APPLICATIONS

This application is based upon and claims the benefit of priority from the prior Japanese Patent Application No. 2011-190472, filed on Sep. 1, 2011; the entire contents of which are incorporated herein by reference.

FIELD

Embodiments described herein relate generally to a method for manufacturing molecular memory device.

BACKGROUND

Recently, molecular memory devices using polymers as storage elements have been proposed. In a molecular memory device, a polymer is placed between a lower electrode and an upper electrode. By controlling the state of the polymer, the electrical resistance between the lower electrode and the upper electrode is varied to store data.

To increase the storage density of such a molecular memory device, the degree of integration of the storage elements need to be increased. Thus, the molecular memory device needs to be manufactured by the LSI (large scale integrated circuit) process.

DETAILED DESCRIPTION

Figure 1A:
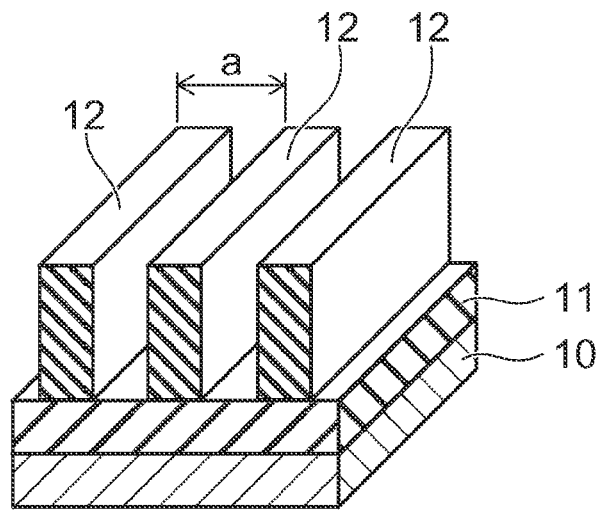
FIGS. 1A to 1C are process perspective views illustrating a method for manufacturing a molecular memory device according to a first embodiment.

In general, according to one embodiment, a method for manufacturing a molecular memory device includes: forming a first wiring layer including a plurality of first wirings extending in a first direction; forming a sacrificial film on the first wiring layer; forming a plurality of core members on the first wiring layer, the core member extending in a second direction crossing the first direction and being formed from an insulating material different from the sacrificial film; forming a second wiring on a side surface of the core member; removing a portion of the sacrificial film located immediately below the second wiring; embedding a polymer serving as a memory material between the first wiring and the second wiring; and embedding an insulating member in a space between the second wirings between the core members.

In general, according to another embodiment, a method for manufacturing a molecular memory device includes: forming a first wiring layer including a plurality of first wirings extending in a first direction; forming a sacrificial film on the first wiring layer; forming a plurality of core members on the first wiring layer, the core member extending in a second direction crossing the first direction and being formed from an insulating material different from the sacrificial film; forming a second wiring on a side surface of the core member; forming a spacer insulating film on a side surface of the second wiring, the spacer insulating film being formed from an insulating material different from the sacrificial film; removing a portion of the sacrificial film located immediately below the spacer insulating film and below the second wiring; embedding a polymer serving as a memory material between the first wiring and the second wiring; and embedding an insulating member in a space which is between the spacer insulating films and which is also between the core members.

In general, according to another embodiment, a method for manufacturing a molecular memory device includes: forming a first wiring layer including a plurality of first wirings extending in a first direction; forming a plurality of core members on the first wiring layer, the core member extending in a second direction crossing the first direction; forming a sacrificial film to cover the core member, the sacrificial film being formed from an insulating material different from the core member; forming a second wiring on a side surface of the core member; removing a portion of the sacrificial film located immediately below the second wiring; embedding a polymer serving as a memory material between the first wiring and the second wiring; and embedding an insulating member in a space between the second wirings between the core members.

Embodiments of the invention will now be described with reference to the drawings.

First, a first embodiment is described.

FIGS. 1A to 1C, FIGS. 2A to 2C, FIGS. 3A and 3B, FIGS. 4A and 4B, and FIG. 5 are process perspective views illustrating a method for manufacturing a molecular memory device according to this embodiment.

Figure 6A:
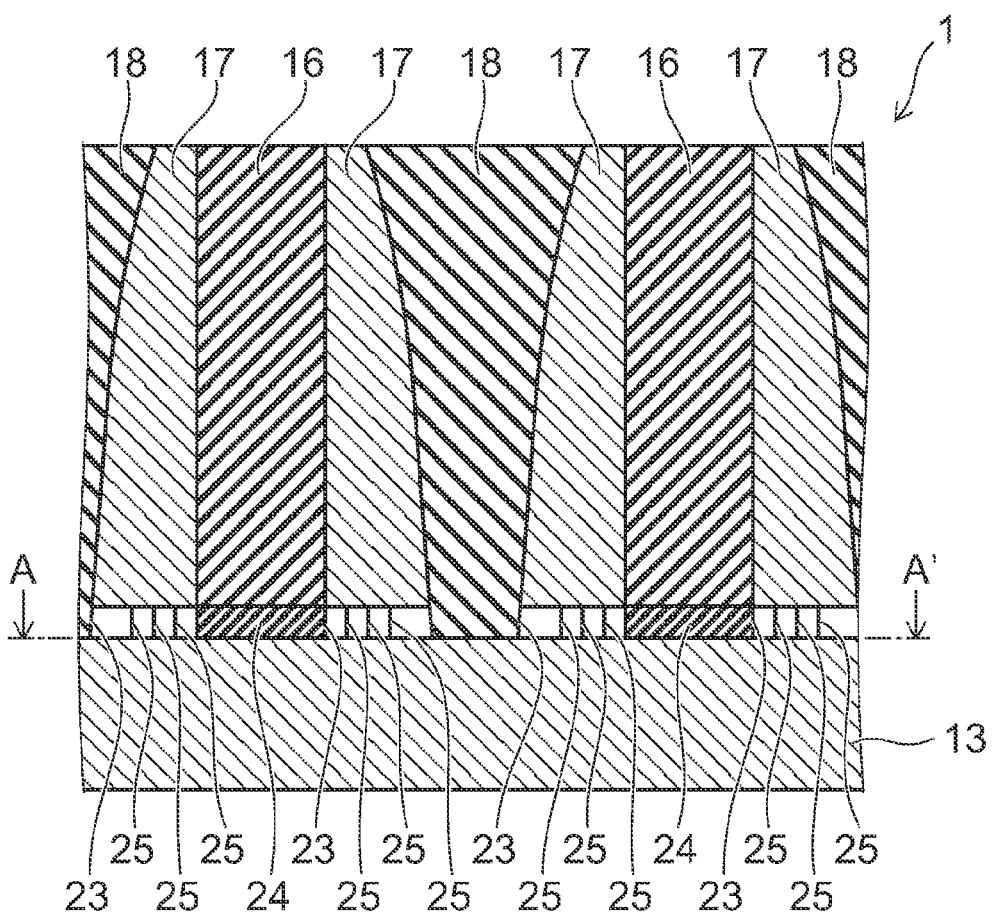
FIG. 6A is a sectional view illustrating the molecular memory device according to the first embodiment.
Figure 6B:
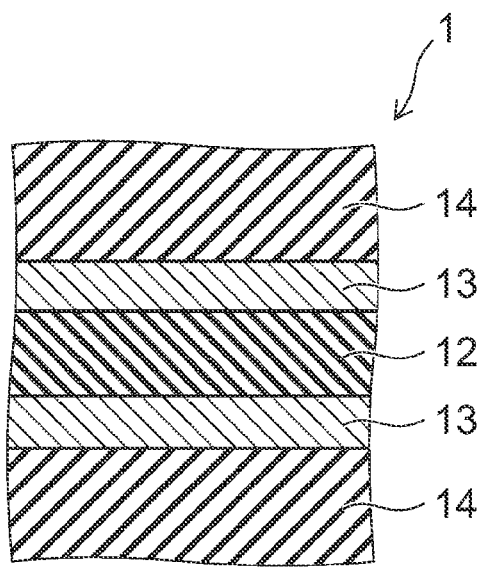
FIG. 6B is a sectional view taken along line A-A' shown in FIG. 6A.

FIG. 6A is a sectional view illustrating the molecular memory device according to this embodiment. FIG. 6B is a sectional view taken along line A-A' shown in FIG. 6A.

First, as shown in FIG. 1A, on a silicon substrate 10, by e.g. the LPCVD (low pressure chemical vapor deposition) method, a silicon oxide film 11 is formed as an interlayer insulating film. Next, by the LPCVD method or PCVD (plasma CVD) method, a silicon nitride film is formed. Next, by using the lithography method, on the silicon nitride film, an LS (line-and-space) pattern of photoresist (not shown) is formed. Here, the arrangement pitch of the LS pattern is denoted by a. Next, this photoresist is used as a mask to perform etching such as RIE (reactive ion etching) to process the silicon nitride film into an LS pattern. Thus, on the silicon oxide film 11, a plurality of line-shaped silicon nitride members 12 extending in one direction and periodically arranged are formed.

Figure 1B:
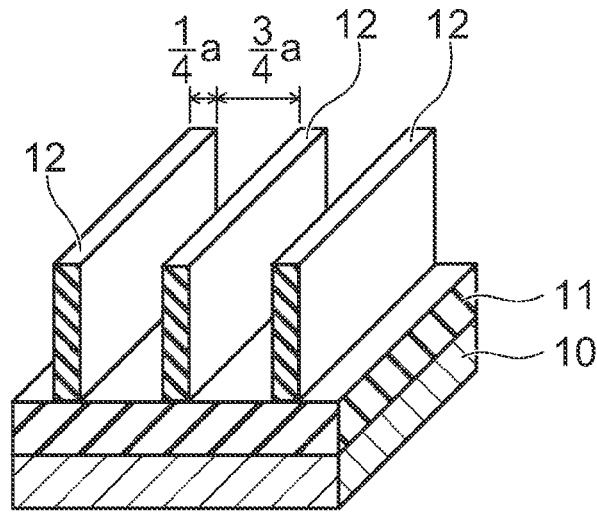

Next, as shown in FIG. 1B, slimming of the silicon nitride member 12 is also performed. Thus, the width of the silicon nitride member 12 is narrowed. For instance, the width of each silicon nitride member 12 is set to (¼)a. The distance between the adjacent silicon nitride members 12, i.e., the width of the space region, is set to (¾)a.

Figure 1C:
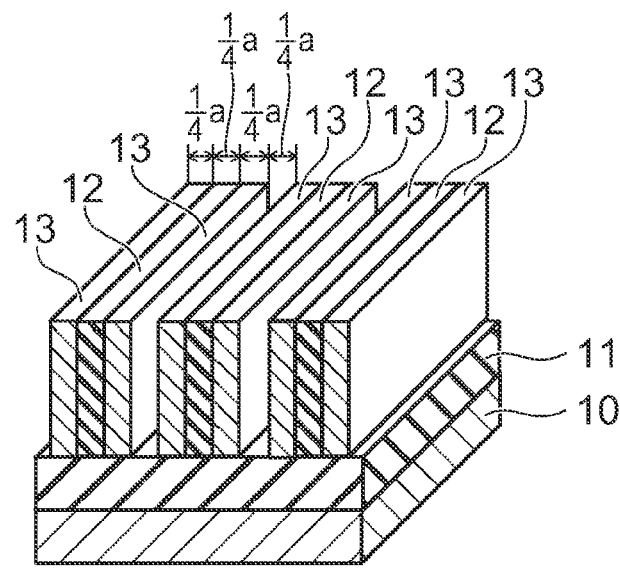

Next, as shown in FIG. 1C, by e.g. the CVD method, a metal film is formed with a uniform thickness on the entire surface. At this time, the film thickness of the metal film is set to (¼)a. The material of the metal film is e.g. tungsten, which is easily film-formed by the CVD method. Depending on the material of the metal film, a seed layer may be formed before forming the metal film. This seed layer also functions as a barrier metal layer for suppressing diffusion of metal. For instance, in the case where the material of the metal film is tungsten, the material of the seed layer can be titanium nitride.

Next, by performing RIE, the metal film is etched back. Thus, in the metal film, the portion formed on the upper surface of the silicon oxide film 11 and the portion formed on the upper surface of the silicon nitride member 12 are removed, whereas the portion formed on the side surface of the silicon nitride member 12 remains. As a result, on the side surface of the silicon nitride member 12, a spacer-shaped metal wiring 13 made of metal and having a width of approximately (¼)a is formed. At this time, the width of the space region between the metal wirings 13 is also made equal to approximately (¼)a. Here, in the case where the aforementioned seed layer has been formed, the seed layer is also removed from the space region when the metal film is processed.

Figure 2A:
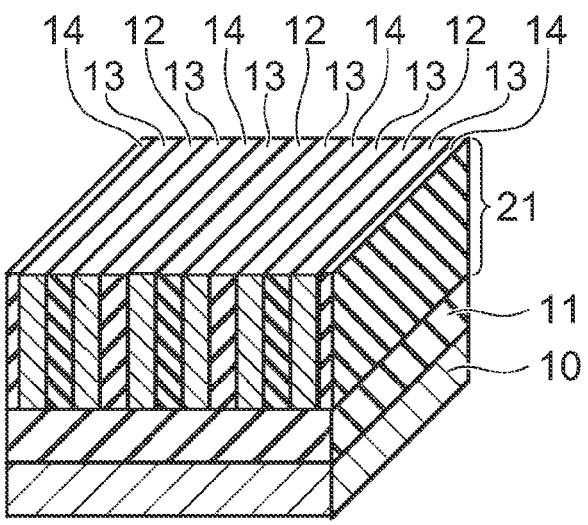
FIGS. 2A to 2C are process perspective views illustrating a method for manufacturing a molecular memory device according to the first embodiment.

Next, as shown in FIG. 2A, by an anisotropic CVD method such as the HDP-CVD (high density plasma CVD) method, silicon oxide is deposited to form a silicon oxide film on the entire surface so as to cover the silicon nitride member 12 and the metal wiring 13. Next, by performing planarization processing such as CMP (chemical mechanical processing) using the silicon nitride member 12 as a stopper, the portion of the silicon oxide film formed on the upper surface of the silicon nitride member 12 and the metal wiring 13 is removed. As a result, a silicon oxide member 14 is embedded in the space between the metal wirings 13 located between the adjacent silicon nitride members 12. Thus, a wiring layer 21 made of the silicon nitride member 12, the metal wiring 13, and the silicon oxide member 14 is formed. Here, as described above, the width of the space region between the metal wirings 13 is approximately (¼)a. Hence, the width of the silicon oxide member 14 embedded between the metal wirings 13 is also approximately (¼)a.

Figure 2B:
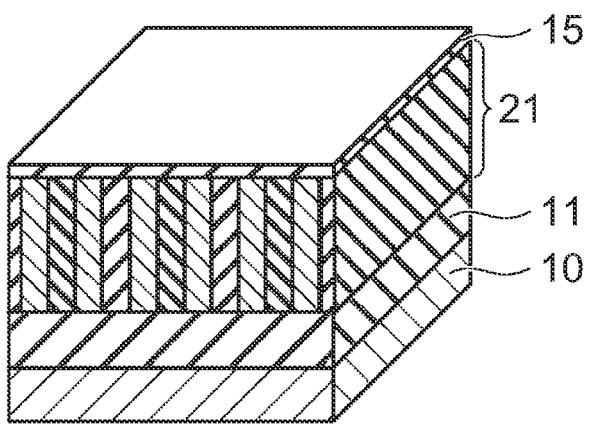

Next, as shown in FIG. 2B, on the wiring layer 21, by e.g. the CVD method or ALD (atomic layer deposition) method, a silicon oxide film 15 is formed. The silicon oxide film 15 is a sacrificial film which will be partly removed in a later step to form an air gap where a polymer serving as a memory material is to be placed. The film thickness of the silicon oxide film 15 is set to less than half the distance between the metal wirings 13, i.e., less than (⅛)a, and comparable to the molecular length of the polymer 25 (see FIG. 6A) described later.

Figure 2C:
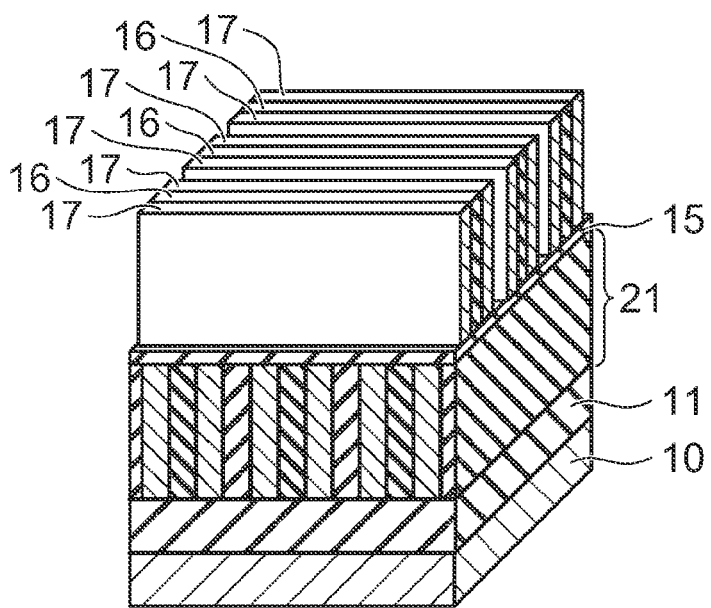

Next, as shown in FIG. 2C, on the silicon oxide film 15, a silicon nitride film is formed. Next, by a method similar to that for the silicon nitride member 12, the silicon nitride film is processed into an LS pattern and slimmed to form a plurality of line-shaped silicon nitride members 16. At this time, the extending direction of the silicon nitride member 16 is made orthogonal to the extending direction of the silicon nitride member 12. Here, the processing of the silicon nitride member 16 is preferably performed by a method having a high selection ratio with respect to the silicon oxide film 15. This is because if the silicon oxide film 15 is abraded, it is difficult to form an air gap in a later step.

Next, by a method similar to that for the metal wiring 13, a metal wiring 17 is formed on the side surface of the silicon nitride member 16. However, the material of the metal wiring 17 is made different from the material of the metal wiring 13. For instance, the metal wiring 17 is formed from molybdenum. Thus, a pair of metal wirings 17 are placed between the adjacent silicon nitride members 16, and a space opening upward is formed between this pair of metal wirings 17. The width of this space, i.e., the distance between the metal wirings 17 between the adjacent silicon nitride members 16, is made longer than twice the film thickness of the silicon oxide film 15. For instance, if the arrangement pitch of the silicon nitride members 16 is a, its width is (¼)a, and the width of the metal wiring 17 is (¼)a, then the distance between the metal wirings 17 is (¼)a.

Figure 3A:
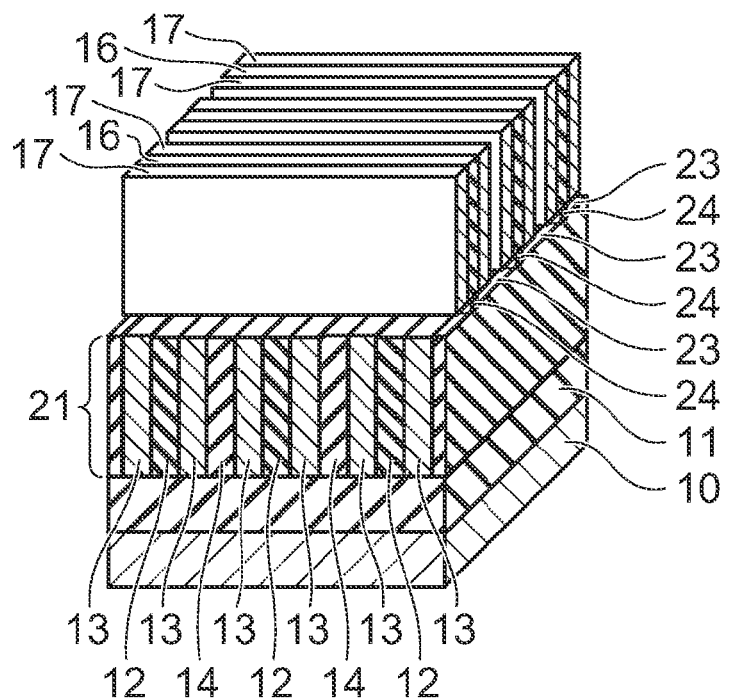
FIGS. 3A and 3B are process perspective views illustrating a method for manufacturing a molecular memory device according to the first embodiment.

Next, as shown in FIG. 3A, wet etching is performed with an etching liquid containing hydrofluoric acid. The etching condition at this time is set so that the etching rate of the silicon oxide film 15 is higher than the etching rate of the silicon oxide member 14. The etching amount is set so that the silicon oxide film 15 is etched to a depth of (¼)a or more and less than (⅜)a. Thus, the portion of the silicon oxide film 15 located immediately below the space between the metal wirings 17 is etched and removed. Then, the portion of the silicon oxide film 15 located immediately below the metal wiring 17 is laterally etched and removed. Thus, an air gap 23 is formed immediately below the metal wiring 17. On the other hand, the portion of the silicon oxide film 15 located immediately below the silicon nitride member 16 remains as a column member 24 made of silicon oxide.

Next, a solution dispersed with numerous polymers 25 (see FIG. 6A) in a solvent is applied. This solution is caused to penetrate into the air gap 23, and then dried. The polymer 25 is a memory material changing its electronic state under application of voltage or current, and changing its electrical resistance. For instance, the polymer 25 is a molecule in which a linker having high affinity for the material of the metal wiring 13 or 17 is provided at one end of a linear polymer. The length of the polymer 25 is made comparable with the height of the air gap 23. The solvent is e.g. water or ethanol.

Thus, the linker of the polymer 25 is coupled to the metal wiring 13 or 17. Accordingly, a monomolecular layer of the polymers 25 is formed on the upper surface of the metal wiring 13 or on the lower surface of the metal wiring 17. At this time, by adjusting the concentration of the solution and the time from its application to drying, the density of the polymers 25 can be controlled. As a result, the polymer 25 is placed between the metal wiring 13 and the metal wiring 17.

Each polymer 25 extends vertically. One end thereof is coupled to the metal wiring 13 or 17 via the linker. The other end is in contact with the metal wiring 17 or 13, or comes close enough to allow electrical interaction. Thus, the polymer 25 is connected between the metal wiring 13 and the metal wiring 17. Here, the length of the polymer 25 is set shorter than half the distance between the adjacent metal wirings 17. Then, even if the polymers 25 extend from both the adjacent metal wirings 17 and are coupled to each other, the polymers 25 cause no short circuit between the adjacent metal wirings 17.

Figure 3B:
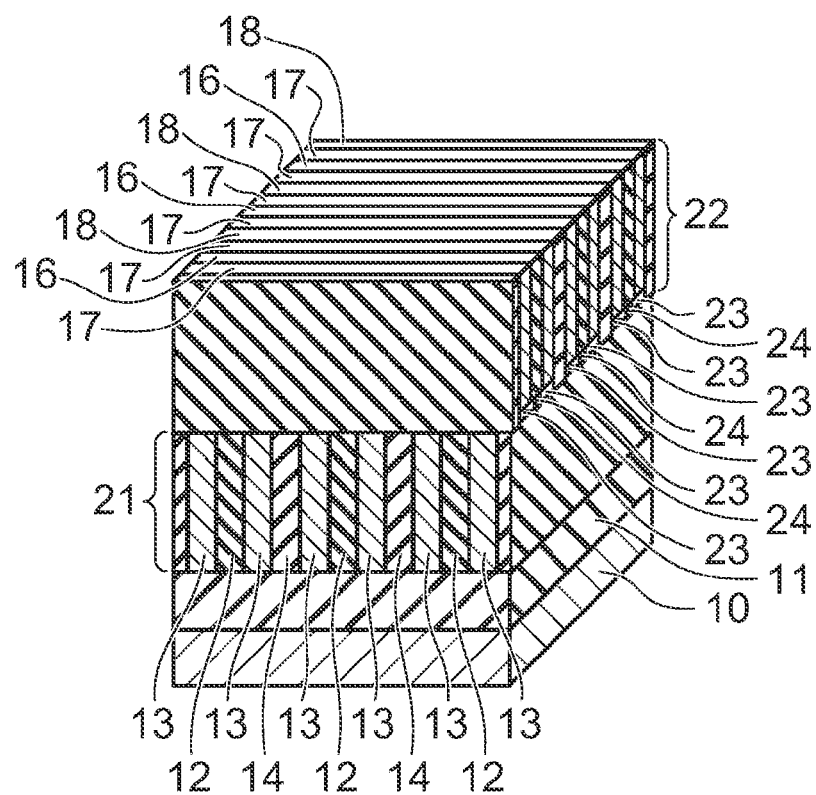

Next, as shown in FIG. 3B, by an anisotropic CVD method such as the HDP-CVD method, silicon oxide is deposited to form a silicon oxide film on the entire surface so as to cover the silicon nitride member 16 and the metal wiring 17. Next, by performing planarization processing such as CMP using the silicon nitride member 16 as a stopper, the portion of the silicon oxide film formed on the upper surface of the silicon nitride member 16 and the metal wiring 17 is removed. Thus, a silicon oxide member 18 is embedded in the space between the metal wirings 17 located between the silicon nitride members 16. As a result, a wiring layer 22 made of the silicon nitride member 16, the metal wiring 17, and the silicon oxide member 18 is formed.

Subsequently, likewise, a silicon oxide film 15, a wiring layer 21, a silicon oxide film 15, and a wiring layer 22 are repetitively formed. Each time the wiring layer is formed, the portion of the silicon oxide film 15 located immediately below the metal wiring is removed to form an air gap, and a polymer is placed in this air gap.

Figure 4A:
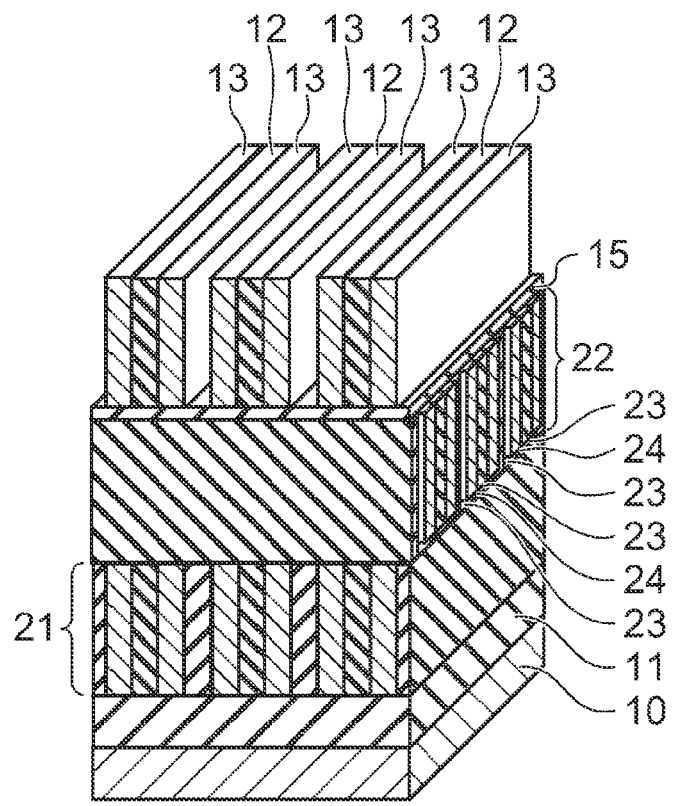
FIGS. 4A and 4B are process perspective views illustrating a method for manufacturing a molecular memory device according to the first embodiment.

More specifically, as shown in FIG. 4A, on the wiring layer 22, a silicon oxide film 15 is formed. Next, on the silicon oxide film 15, a plurality of silicon nitride members 12 are formed. On the side surface of each silicon nitride member 12, a metal wiring 13 is formed.

Figure 4B:
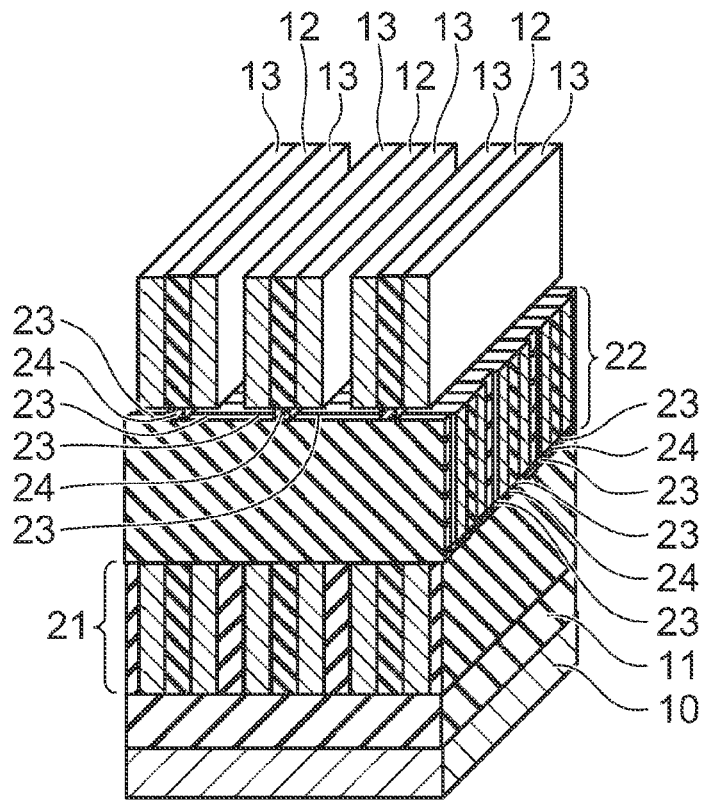

Next, as shown in FIG. 4B, the silicon oxide film 15 is wet etched via the space between the metal wirings 13. Thus, in the silicon oxide film 15, the portion located immediately below the metal wiring 13 is removed to form an air gap 23, and the portion located immediately below the silicon nitride member 12 is left as a column member 24.

Subsequently, by repeating this process, a cross-point molecular memory device 1 can be manufactured.

Figure 5:
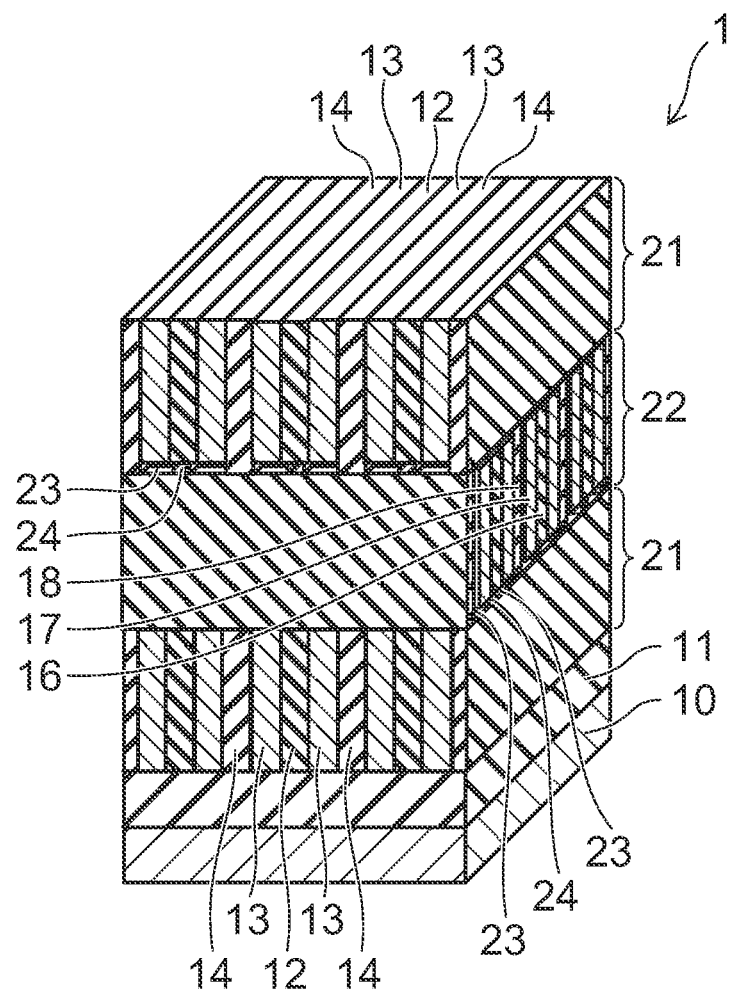
FIG. 5 is a process perspective view illustrating a method for manufacturing a molecular memory device according to the first embodiment.

As shown in FIG. 5 and FIGS. 6A and 6B, the molecular memory device 1 according to this embodiment includes a silicon substrate 10. On the silicon substrate 10, a silicon oxide film 11 is provided as an interlayer insulating film. On the silicon oxide film 11, wiring layers 21 and wiring layers 22 are alternately stacked.

In the wiring layer 21, a plurality of line-shaped silicon nitride members 12 and a plurality of line-shaped silicon oxide members 14 are alternately arranged. Between the silicon nitride member 12 and the silicon oxide member 14, a line-shaped metal wiring 13 is provided. On the other hand, in the wiring layer 22, a plurality of line-shaped silicon nitride members 16 and a plurality of line-shaped silicon oxide members 18 are alternately arranged. Between the silicon nitride member 16 and the silicon oxide member 18, a line-shaped metal wiring 17 is provided. The extending direction of the silicon nitride member 12, the silicon oxide member 14, and the metal wiring 13, and the extending direction of the silicon nitride member 16, the silicon oxide member 18, and the metal wiring 17, are orthogonal to each other. The widths of the silicon nitride member 12, the silicon oxide member 14, the metal wiring 13, the silicon nitride member 16, the silicon oxide member 18, and the metal wiring 17 are generally equal to each other, (¼)a.

Between the wiring layer 21 and the next higher wiring layer 22, an air gap 23 and a column member 24 made of silicon oxide are provided. The air gap 23 is located in a line shape immediately below the metal wiring 17. The column member 24 is provided in a line shape immediately below the silicon nitride member 16. The height of the air gap 23 and the column member 24 is smaller than the distance between the metal wirings 13 and the distance between the metal wirings 17, i.e., approximately (¼)a. On the other hand, the silicon oxide member 18 is in contact with the wiring layer 21.

On the other hand, between the wiring layer 22 and the next higher wiring layer 21, the air gap 23 is located in a line shape immediately below the metal wiring 13. The column member 24 is provided in a line shape immediately below the silicon nitride member 12. The silicon oxide member 14 is in contact with the wiring layer 22.

Inside the air gap 23, a plurality of polymers 25 are placed. The polymers 25 constitute a SAM (self-assembled monolayer). For instance, the polymer 25 has a linear molecular structure, and a linker (not shown) is provided at one end thereof. Thus, in the polymer 25 placed between the metal wiring 13 and the metal wiring 17, one end thereof is coupled to one of the metal wirings 13 and 17 via the linker, and the other end is in contact with the other of the metal wirings 13 and 17, or comes close enough to allow electrical interaction. Thus, each polymer 25 is connected between the metal wiring 13 and the metal wiring 17.

The thickness of the metal wirings 13 and 17 is made thinner toward the upper end. In particular, the upper portion is rounded. Accordingly, the width of the silicon oxide members 14 and 18 is widened toward the upper end. In particular, the upper portion is greatly widened.

In the molecular memory device 1, by applying voltage between the metal wiring 13 and the metal wiring 17, the electronic state of the polymer 25 is controlled. Thus, the electrical resistance of the polymer 25 is varied to store data. By measuring the electrical resistance of the polymer 25, the stored data is read.

Next, the operation and effect of this embodiment are described.

In this embodiment, in the step shown in FIG. 2B, a silicon oxide film 15 is formed on the wiring layer 21. In the step shown in FIG. 2C, a metal wiring 17 is formed on the silicon oxide film 15. Then, in the step shown in FIG. 3A, side etching is performed on the silicon oxide film 15 to form an air gap 23 immediately below the metal wiring 17, and a solution is applied thereto to embed a polymer 25 in the air gap 23. Thus, the polymer 25 can be placed between the metal wiring 13 and the metal wiring 17. Accordingly, the method for manufacturing a molecular memory device according to this embodiment is highly compatible with the LSI process. Thus, the molecular memory device 1 can be manufactured by using the LSI process.

In contrast, suppose the layers of the molecular memory device are formed sequentially from bottom to top. Then, the metal wiring 17 is formed after forming a monomolecular layer of polymers 25 on the wiring layer 21. However, in this case, the metal material forming the metal wiring 17 penetrates between the polymers 25. This may cause a short circuit between the metal wiring 13 and the metal wiring 17.

Furthermore, in this embodiment, the etching amount of the silicon oxide film 15 is set to (¼)a or more and less than (⅜)a. By setting the etching amount to (¼)a or more, the silicon oxide film 15 can be reliably removed from between the metal wiring 13 and the metal wiring 17. This can prevent the leakage current from flowing via the silicon oxide film 15 during the operation of the molecular memory device 1. Thus, the operation can be stabilized. However, if the sacrificial film is formed from an insulating material having high charge trapping capability, the leakage current is reduced, and there may be no problem in practice.

On the other hand, by setting the etching amount to less than (⅜)a, the column member 24 can be left immediately below the silicon nitride member 16. Thus, the silicon nitride member 16 and the metal wiring 17 can be supported. Here, even in the case where the etching amount is in the range of (¼)a or more and less than (⅜)a, the column member 24 is narrowed with the increase of the etching amount. This causes the possibility of collapse of the silicon nitride member 16 and the metal wiring 17, and requires attention.

Furthermore, in this embodiment, the silicon oxide member 14 is formed by the anisotropic CVD method such as the HDP-CVD method, and the silicon oxide film 15 is formed by the CVD method or ALD method. Thus, the etching rate of the silicon oxide film 15 is made higher than the etching rate of the silicon oxide member 14. This can suppress etching of the silicon oxide member 14 when etching the silicon oxide film 15. Here, even in the case where the silicon oxide members 14 and 15 are formed by the same film formation method, the etching rate of the silicon oxide film 15 can be made higher by making lower the film formation temperature of the silicon oxide film 15.

Figure 7A:
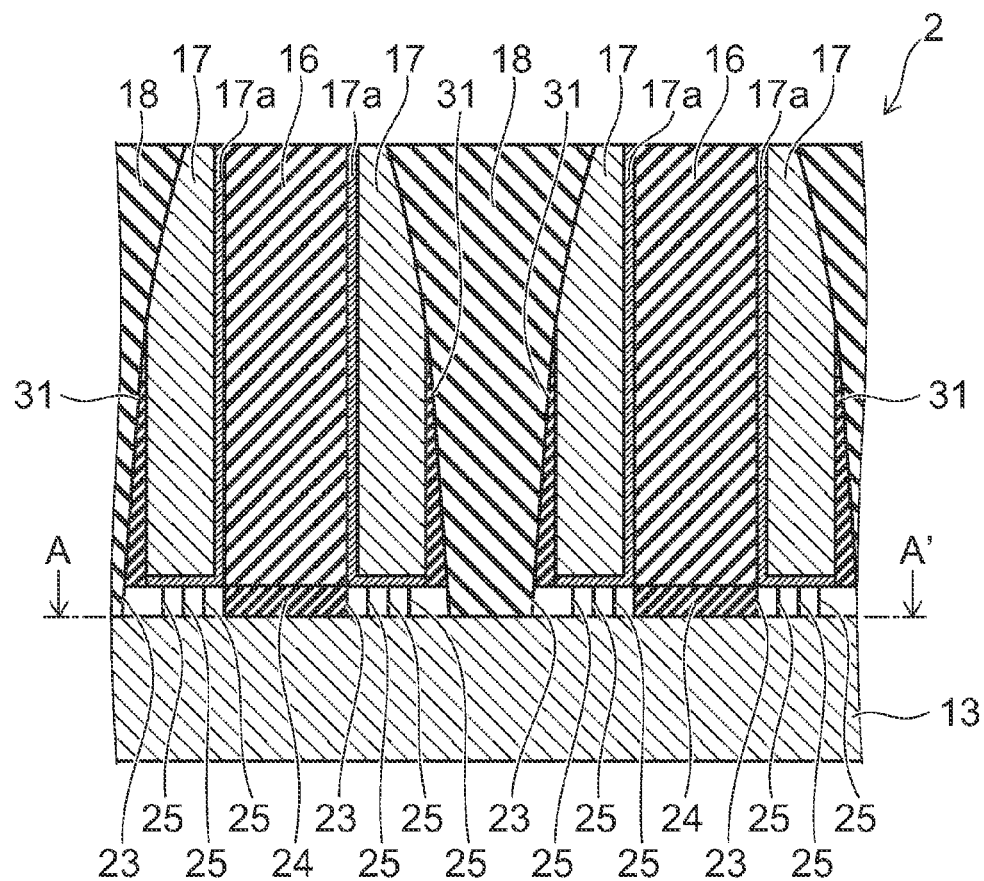
FIG. 7A is a sectional view illustrating a molecular memory device according to a seconds embodiment.
Figure 7B:
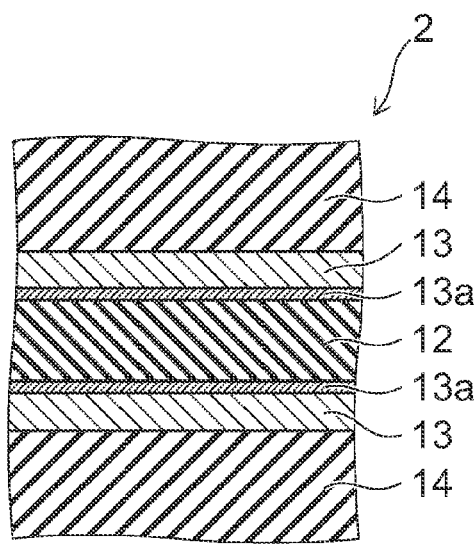
FIG. 7B is a sectional view taken along line A-A' shown in FIG. 7A.

Next, a second embodiment is described,

FIG. 7A is a sectional view illustrating a molecular memory device according to this embodiment. FIG. 7B is a sectional view taken along line A-A' shown in FIG. 7A.

First, a method for manufacturing a molecular memory device according to this embodiment is described.

This embodiment is different from the above first embodiment in that a seed layer is formed before forming the metal wirings 13 and 17, and that a silicon nitride film 31 is formed after forming the metal wirings 13 and 17.

In this embodiment, first, as shown in FIGS. 1A and 1B, a silicon nitride member 12 is formed on the silicon oxide film 11. Next, a titanium nitride layer is formed on the entire surface as a seed layer 13a (see FIG. 7B). Next, as shown in FIG. 1C, a metal wiring 13 made of tungsten is formed on the side surface of the silicon nitride member 12. At this time, the seed layer 13a is removed from the region between the metal wirings 13 on the upper surface of the silicon oxide film 11.

Next, as shown in FIG. 7B, a silicon nitride film 31 (see FIG. 7A) is formed on the entire surface. Next, etch-back is performed by e.g. RIE. Thus, in the silicon nitride film 31, the portion formed on the upper surface of the silicon oxide film 11 and the portion formed on the upper surface of the silicon nitride member 12 and the metal wiring 13 are removed, whereas the portion formed on the side surface of the metal wiring 13 is left. Thus, the silicon nitride film 31 is processed into a spacer shape.

Next, as shown in FIG. 2A, a silicon oxide member 14 is embedded between the silicon nitride films 31. Then, CMP is performed to form a wiring layer 21. Next, as shown in FIG. 2B, on the wiring layer 21, a silicon oxide film 15 is formed as a sacrificial film. Next, as shown in FIG. 2C, a silicon nitride member 16 is formed on the silicon oxide film 15.

Next, a seed layer 17a (see FIG. 7A) is formed on the entire surface. Next, as shown in FIG. 2C, a silicon nitride member 16 is formed. Next, a metal wiring 17 is formed on the side surface of the silicon nitride member 16. At this time, the seed layer 17a is removed from the region between the metal wirings 17 on the upper surface of the silicon oxide film 15. Next, similarly to the above process, a silicon nitride film 31 is formed on the side surface of the metal wiring 17.

Next, as shown in FIG. 3A, side etching is performed on the silicon oxide film 15 to form an air gap 23 and a column member 24. At this time, the etching amount of the silicon oxide film 15 is made larger than in the above first embodiment to remove the silicon oxide film 15 also from immediately below the silicon nitride film 31 and the seed layer 17a. Next, as shown in FIG. 3B, a silicon oxide member 18 is embedded between the silicon nitride films 31 and subjected to CMP. Thus, a wiring layer 22 is formed. Subsequently, a similar process is repeated.

Thus, the molecular memory device 2 shown in FIGS. 7A and 7B is manufactured. In the molecular memory device 2, the silicon nitride film 31 is provided between the metal wiring 13 and the silicon oxide member 14, and between the metal wiring 17 and the silicon oxide member 18. Furthermore, the seed layer is provided on the side surface of the silicon nitride member side of each metal wiring and on the lower surface thereof.

In this embodiment, the silicon nitride film 31 denser than the silicon oxide film is provided between the metal wiring 17 and the silicon oxide member 18. Thus, the metal wiring 17 and the silicon oxide member 18 are separated from each other. This can prevent the leakage current from flowing between the metal wiring 17 and the metal wiring 13 via the silicon oxide member 18. Furthermore, immediately below the silicon nitride film 31, the air gap 23 is formed, and the silicon oxide member 18 is not formed. Thus, the leakage current via the silicon oxide member 18 in this portion can also be prevented.

Furthermore, the silicon nitride film is denser in film quality than the silicon oxide film, and can suppress diffusion of oxygen. More specifically, after forming the metal wiring 17, the surface of the metal wiring 17 is covered with the silicon nitride film 31. Thus, when the silicon oxide member 18 is subsequently deposited, the silicon nitride film 31 can prevent formation of a metal oxide layer by injection of oxygen into the surface of the metal wiring 17. Accordingly, the increase of the electrical resistance of the metal wiring 17 can be prevented. These effects can be similarly achieved also in the case where a silicon nitride film is provided between the metal wiring 13 and the silicon oxide member 14.

Moreover, in this embodiment, a seed layer is provided before forming each metal wiring. This improves the coverage performance in depositing a metal. Furthermore, this can prevent the metal contained in the metal wiring from diffusing into the surroundings. Thus, even if the metal wiring is miniaturized, the metal wiring can be stably formed, and the increase of resistance can be suppressed.

Thus, as compared with the above first embodiment, this embodiment can suppress the leakage current between the metal wirings and reduce the resistance of the metal wiring. Here, the silicon nitride film 31 is processed into a spacer shape by etch-back. Hence, the side surface of the uppermost portion of the metal wiring 17 may fail to be covered with the silicon nitride film 31. However, even in this case, most of the side surface of the metal wiring 17 is covered with the silicon nitride film 31. Hence, a considerable effect can be achieved. The manufacturing method, configuration, and effect of this embodiment other than the foregoing are similar to those of the above first embodiment.

Next, a third embodiment is described.

Figure 8A:
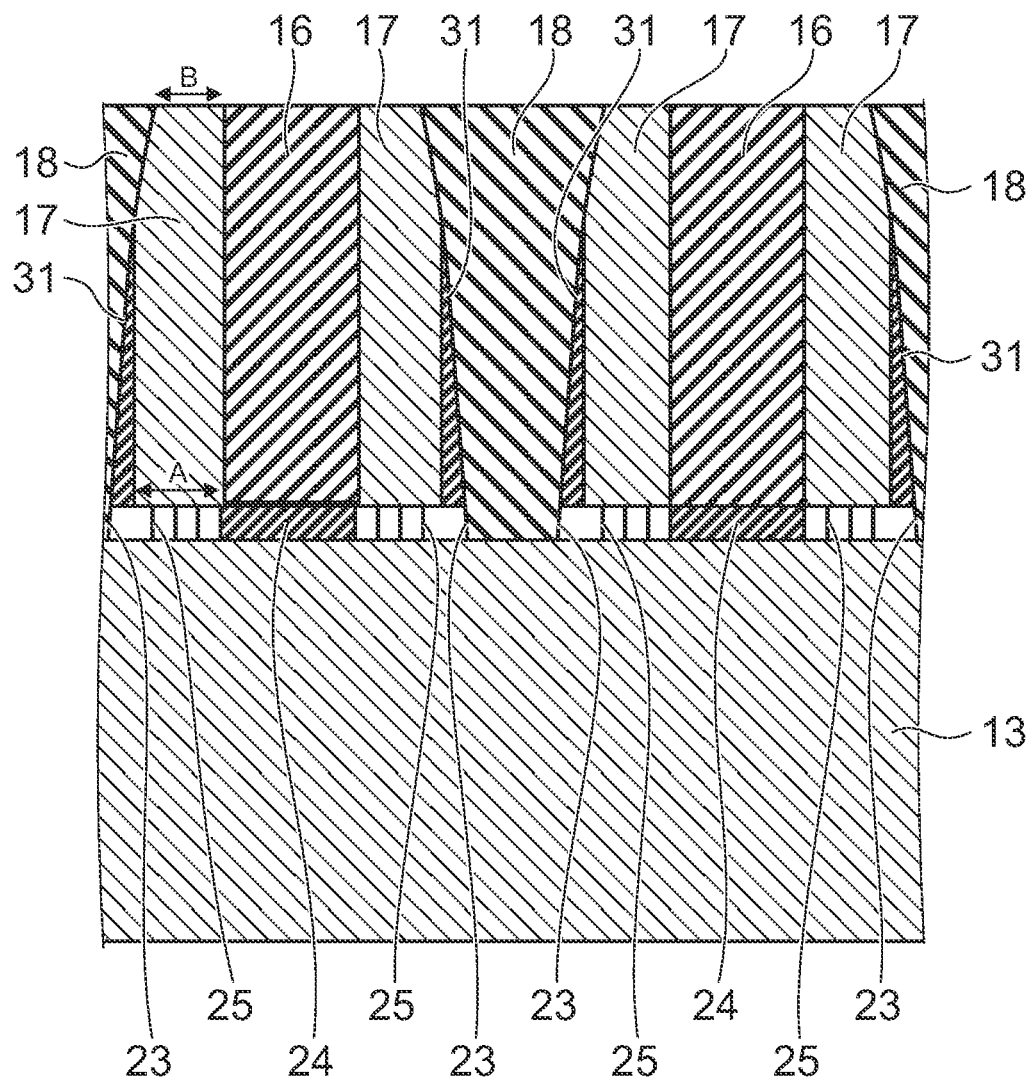
FIG. 8A is a sectional view illustrating an aspect of the molecular memory device according to a third embodiment.
Figure 8B:
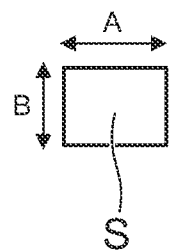
FIG. 8B is a plan view illustrating the overlapping region of metal wirings.

FIG. 8A is a sectional view illustrating an aspect of the molecular memory device according to this embodiment. FIG. 8B is a plan view illustrating the overlapping region of metal wirings.

Figure 9A:
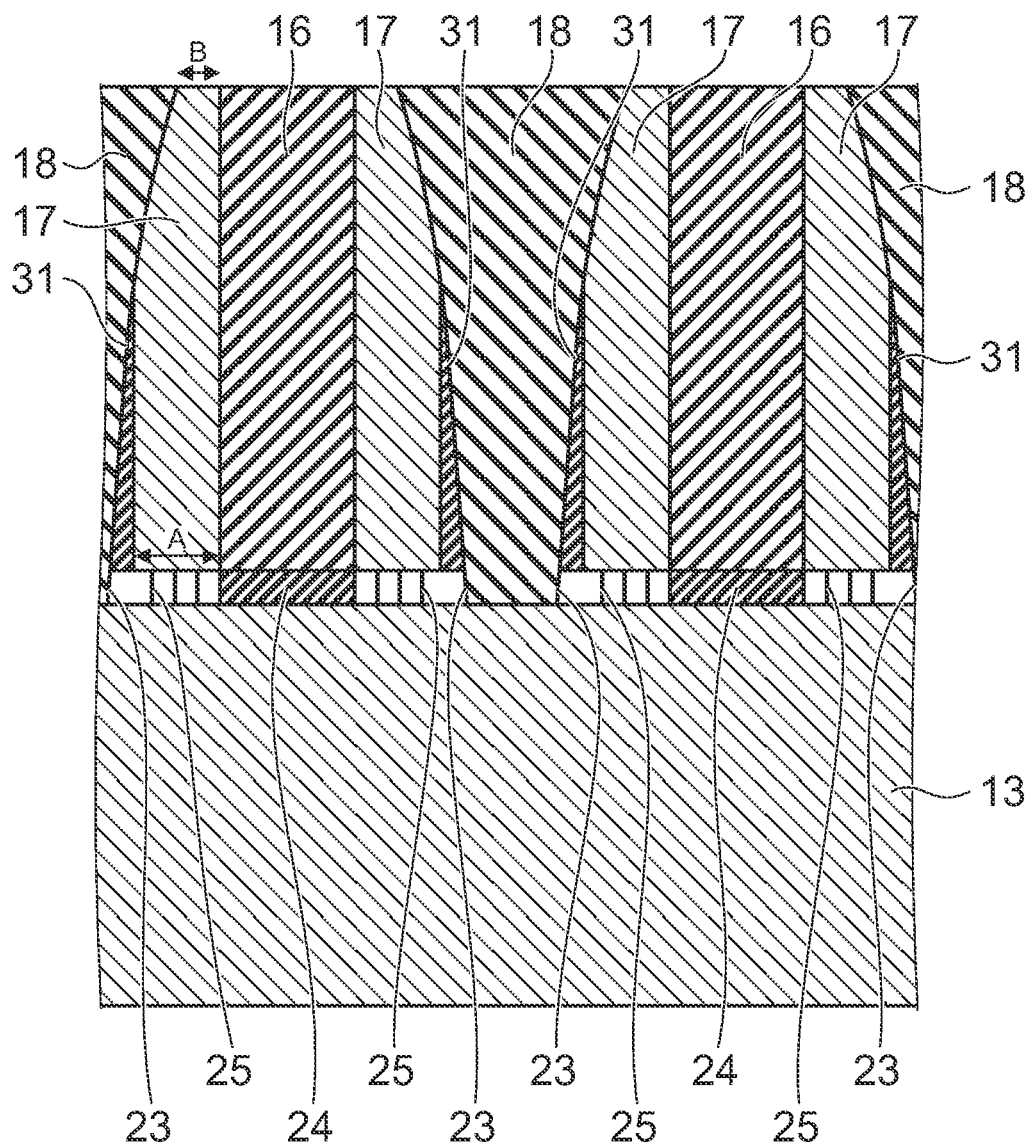
FIG. 9A is a sectional view illustrating an alternative aspect of the molecular memory device according to the third embodiment.
Figure 9B:
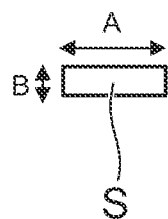
FIG. 9B is a plan view illustrating the overlapping region of metal wirings.

FIG. 9A is a sectional view illustrating an alternative aspect of the molecular memory device according to this embodiment. FIG. 9B is a plan view illustrating the overlapping region of metal wirings.

In this embodiment, the polishing amount is adjusted in the CMP step shown in FIG. 2A and the CMP step shown in FIG. 3B to control the number of polymers 25 connected between the metal wirings.

As viewed from above, the polymer 25 connected between the metal wiring 13 of the wiring layer 21 and the metal wiring 17 of the wiring layer 22 is placed in the overlapping region S of the upper surface of the metal wiring 13 and the lower surface of the metal wiring 17. Thus, the number of polymers 25 connected between the metal wiring 13 and the metal wiring 17 is positively correlated with the area of the region S. The number of polymers 25 connected between these metal wirings determines the amount of current in the on-state and the off-state. The optimal number of polymers 25 depends on the design of the molecular memory device. However, to reduce power consumption, the number of polymers 25 is preferably smaller.

As shown in FIGS. 8A and 8B, in each metal wiring, the width in the lower end portion is denoted by A, and the width in the upper end portion is denoted by B. Then, as viewed from above, the overlapping region S of the upper surface of the lower-side metal wiring and the lower surface of the upper-side metal wiring is shaped like a rectangle in which one side has a length of A and the other side has a length of B. If the polishing amount is decreased in the CMP steps shown in FIGS. 2A and 3B, then as shown in FIGS. 9A and 9B, the thickness B in the upper end portion of the metal wiring is made smaller, and the area of the region S is made smaller. Accordingly, the number of polymers 25 is made smaller, and the power consumption is reduced.

Thus, according to this embodiment, by adjusting the polishing amount of the upper surface of the wiring layer 21 and the upper surface of the wiring layer 22, the area of the region S can be controlled, and the number of polymers 25 can be controlled. Accordingly, the power consumption of the molecular memory device can be controlled. The manufacturing method, configuration, and effect of this embodiment other than the foregoing are similar to those of the above second embodiment.

Next, a fourth embodiment is described.

FIGS. 10A to 10C and FIGS. 11A to 11C are process sectional views illustrating a method for manufacturing a molecular memory device according to this embodiment.

In the following description, the method for forming the wiring layer 22 is taken as an example. However, the method for forming the wiring layer 21 is similar thereto.

Figure 10A:
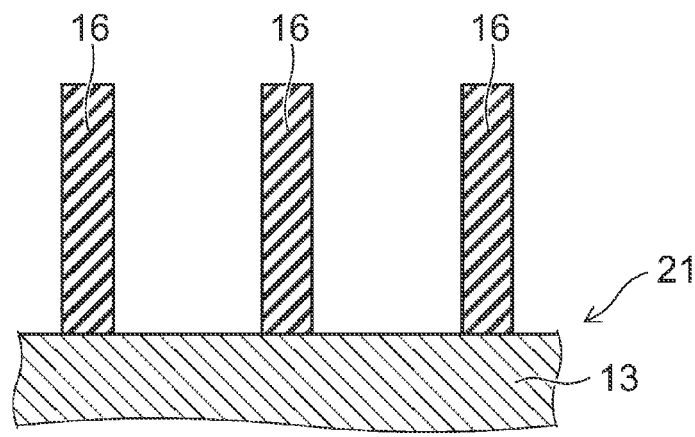
FIGS. 10A to 10C are process sectional views illustrating a method for manufacturing a molecular memory device according to a fourth embodiment.

As shown in FIG. 10A, on the wiring layer 21 including metal wirings 13, a plurality of silicon nitride members 16 extending in one direction are formed as core members.

Figure 10B:
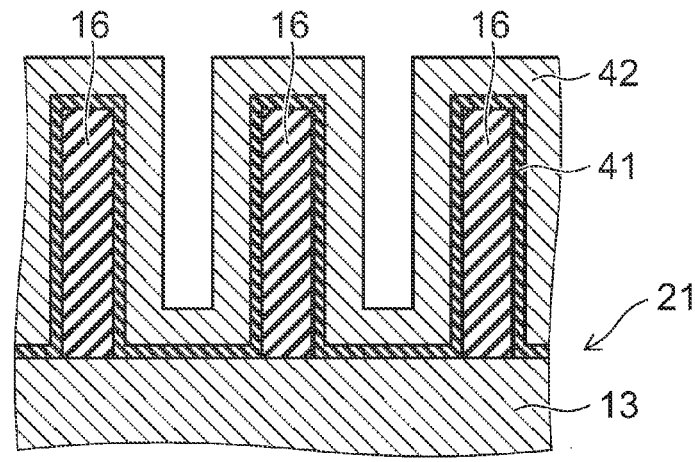

Next, as shown in FIG. 10B, a silicon oxide film 41 is formed as a sacrificial film on the entire surface. The silicon oxide film 41 covers not only the upper surface of the wiring layer 21, but also the upper surface and side surface of each silicon nitride member 16. Next, a metal film 42 is formed on the entire surface.

Figure 10C:
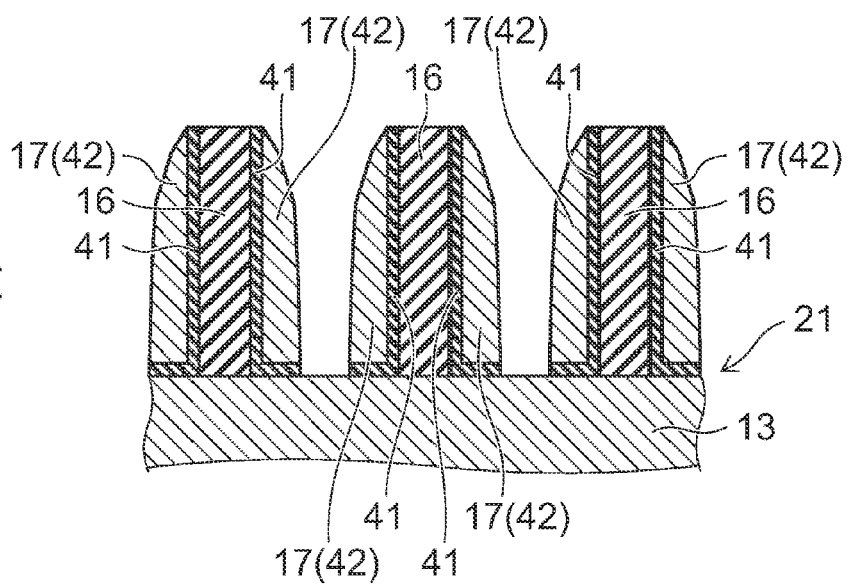

Next, as shown in FIG. 10C, etch-back is performed by e.g. RIE. Thus, in the silicon oxide film 41 and the metal film 42, the portion formed on the upper surface of the silicon nitride member 16 and the portion formed on the upper surface of the wiring layer 21 are removed, whereas the portion formed on the side surface of the silicon nitride member 16 remains. This remaining portion in the metal film 42 constitutes a metal wiring 17 shaped like a sidewall.

Figure 11A:
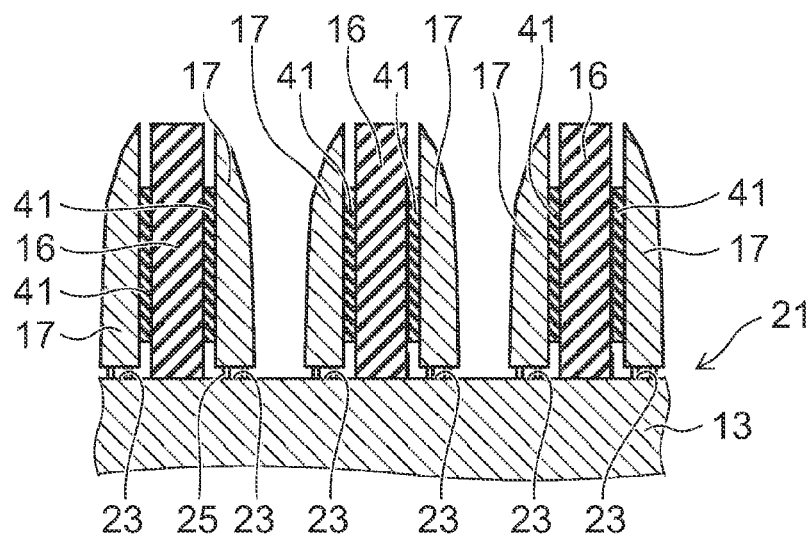
FIGS. 11A to 11C are process sectional views illustrating a method for manufacturing a molecular memory device according to the fourth embodiment.

Next, as shown in FIG. 11A, wet etching is performed with e.g. a hydrofluoric acid-based etching liquid. Thus, the silicon oxide film 41 is etched downward from between the upper end portion of the silicon nitride member 16 and the upper end portion of the metal wiring 17. Simultaneously, side etching proceeds from between the wiring layer 21 and the metal wiring 17 toward the silicon nitride member 16. After the etching surface reaches the silicon nitride member 16, etching proceeds upward between the silicon nitride member 16 and the metal wiring 17. As a result, the portion of the silicon oxide film 41 including the portion immediately below the metal wiring 17 is removed. Thus, the silicon oxide film 41 remains only between the vertically central portion of the silicon nitride member 16 and the vertically central portion of the metal wiring 17.

Next, a solution dispersed with polymers 25 (see FIG. 6A) in a solvent is applied and dried. Thus, polymers 25 are placed in the air gap 23 between the metal wiring 13 of the wiring layer 21 and the metal wiring 17 thereabove.

Figure 11B:
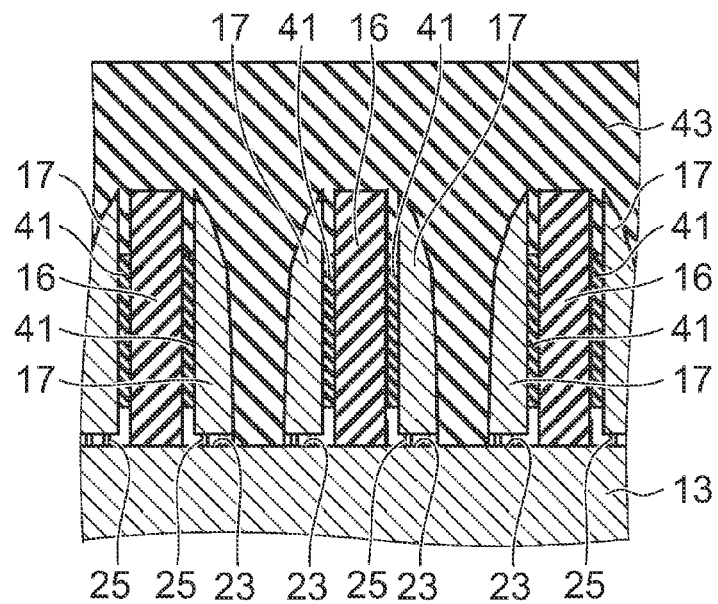

Next, as shown in FIG. 11B, by an anisotropic CVD method such as the HDP-CVD method, silicon oxide is deposited on the entire surface. Thus, a silicon oxide film 43 is formed so as to fill the space between the metal wirings 17. At this time, the silicon oxide film 43 is embedded also in the space between the upper end portion of the silicon nitride member 16 and the upper end portion of the metal wiring 17. On the other hand, the silicon oxide film 43 is not embedded between the wiring layer 21 and the metal wiring 17, and between the lower end portion of the silicon nitride member 16 and the lower end portion of the metal wiring 17. Thus, the silicon oxide film 43 does not penetrate into the air gap 23 between the metal wiring 13 and the metal wiring 17.

Figure 11C:
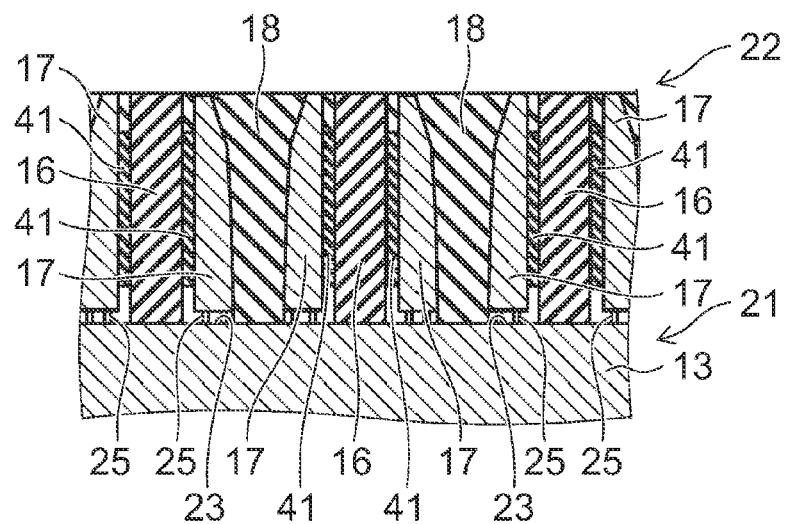

Next, as shown in FIG. 11C, CMP using the silicon nitride member 16 as a stopper is performed to remove the portion of the silicon oxide film 43 formed above the upper surface of the silicon nitride member 16. Thus, a silicon oxide member 18 is formed between the metal wirings 17. Accordingly, a wiring layer 22 made of the silicon nitride member 16, the metal wiring 17, and the silicon oxide member 18 is formed. Subsequently, by repeating a similar process, the molecular memory device according to this embodiment is manufactured.

In this embodiment, in the step shown in FIG. 10B, a silicon oxide film 41 is formed as a sacrificial film. Then, in the steps shown in FIGS. 10B and 10C, a metal wiring 17 is formed. In the step shown in FIG. 11A, the silicon oxide film 41 is removed from between the metal wiring 13 and the metal wiring 17 to form an air gap 23, and polymers 25 are placed therein. Thus, like the above first embodiment, there is no case where the metal material forming the metal wiring 17 penetrates between the polymers 25 and makes a short circuit to the metal wiring 13. Accordingly, the molecular memory device can be manufactured by application of the LSI process. The manufacturing method, configuration, and effect of this embodiment other than the foregoing are similar to those of the above first embodiment.

For instance, in the examples illustrated in the above embodiments, as the core member of the metal wiring, the silicon nitride members 12 and 16 are used. However, the invention is not limited thereto. The core member only needs to have high insulation property, to be resistant to etching when etching the sacrificial film in the step shown in FIG. 3A, and to serve as a stopper for CMP in the steps shown in FIGS. 1C and 3B.

In the examples illustrated in the above embodiments, as the insulating member embedded between the metal wirings, the silicon oxide members 14 and 18 formed by the anisotropic CVD method are used. However, the invention is not limited thereto. The insulating member only needs to have high insulation property, and to enable planarization by CMP using the core member (silicon nitride members 12 and 16) as a stopper in the steps shown in FIGS. 1C and 3B.

Furthermore, in the examples illustrated in the above embodiments, as the sacrificial film for forming an air gap after forming the metal wiring, the silicon oxide film 15 formed by the CVD method or ALD method is used. However, the invention is not limited thereto. The sacrificial film only needs to be a film providing a sufficient etching selection ratio with respect to the core member and the insulating member. However, the remaining portion of the sacrificial film constitutes a column member 24. Hence, the sacrificial film is preferably insulative. As long as these required characteristics are satisfied, the combination of the core member, the insulating member, and the sacrificial film is arbitrary.

Moreover, in the examples illustrated in the above embodiments, the width of the metal wiring and the spacing between the metal wirings are made nearly equal. However, the invention is not limited thereto. Furthermore, in the examples illustrated, the metal wiring 13 and the metal wiring 17 extend in mutually orthogonal directions. However, the invention is not limited thereto as long as these metal wirings extend in directions crossing each other.

The embodiments described above can realize a method for manufacturing a molecular memory device which can be manufactured by the LSI process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a molecular memory device, comprising:
    forming a first wiring layer including a plurality of first wirings extending in a first direction;
    forming a sacrificial film on the first wiring layer;
    forming a plurality of core members on the first wiring layer, the core members extending in a second direction crossing the first direction and being formed from an insulating material different from the sacrificial film;
    forming second wirings on side surfaces of the core members;
    removing portions of the sacrificial film located immediately below the second wirings to form first spaces between the first in and the second wirings;
    embedding, after forming the second wirings and removing the portions of the sacrificial film, a polymer serving as a memory material into the first spaces; and
    embedding an insulating member in a second space between the second wirings between the core members.

2. The method according to claim 1, wherein
    the second wirings are formed from a material different in kind from a material of the first wiring, and
    a linker is provided at one end of the polymer.

3. The method according to claim 1, wherein a distance between the second wirings between adjacent ones of the core members is made longer than twice a film thickness of the sacrificial film.

4. The method according to claim 1, wherein the embedding a polymer includes:
    applying a solution dispersed with the polymer in a solvent; and
    drying the solution.

5. The method according to claim 1, wherein
    the core members are first core members, and
    the forming a first wiring layer includes:
        forming a plurality of second core members extending in the first direction, the second core members being insulative;
        forming the first wirings on side surfaces of the second core members; and
        embedding another insulating member in a third space between the first wirings between the second core members, and
        the removing includes performing etching under a condition such that an etching rate of the sacrificial film is higher than an etching rate of the another insulating member.

6. The method according to claim 1, further comprising:
    forming a spacer insulating film on a side surface of the second wiring, the spacer insulating film being made of a material different in kind from material forming the insulating member.

7. The method according to claim 1, wherein the core members are formed on the sacrificial film.

8. The method according to claim 1, wherein the sacrificial film is formed so as to cover the core member.

9. The method according to claim 1, wherein the embedding an insulating member includes:
    forming an insulating film by entirely depositing another insulating material different in kind from the insulating material forming the core members; and
    removing portions of the insulating film formed on upper surfaces of the core members and the second wirings by performing planarization processing using the core members as a stopper.

10. The method according to claim 1, wherein the sacrificial film is formed from silicon oxide, and the core members are formed from silicon nitride.

* * * * *